United States Patent
Takezoe et al.

(10) Patent No.: US 9,194,984 B2
(45) Date of Patent: Nov. 24, 2015

(54) MICROLENS FOR ORGANIC EL ELEMENT, ORGANIC EL ELEMENT USING THE SAME, AND MANUFACTURING METHODS THEREOF

(71) Applicants: Hideo Takezoe, Tokyo (JP); Wonhoe Koo, Tokyo (JP); Suzushi Nishimura, Yokohama (JP); Soon Moon Jeong, Yokohama (JP)

(72) Inventors: Hideo Takezoe, Tokyo (JP); Wonhoe Koo, Tokyo (JP); Suzushi Nishimura, Yokohama (JP); Soon Moon Jeong, Yokohama (JP)

(73) Assignee: JX NIPPON OIL & ENERGY CORPORATION, Tokyo (JP)

(*) Notice: Subject to any disclaimer, the term of this patent is extended or adjusted under 35 U.S.C. 154(b) by 0 days.

(21) Appl. No.: 14/575,627

(22) Filed: Dec. 18, 2014

(65) Prior Publication Data
US 2015/0104892 A1   Apr. 16, 2015

Related U.S. Application Data

(62) Division of application No. 12/881,025, filed on Sep. 13, 2010, now Pat. No. 9,035,284.

(30) Foreign Application Priority Data

May 14, 2010 (JP) ................ 2010-111867

(51) Int. Cl.
*H01L 51/40* (2006.01)
*G02B 3/00* (2006.01)
*B29D 11/00* (2006.01)
(Continued)

(52) U.S. Cl.
CPC ........ *G02B 3/0031* (2013.01); *B29D 11/00365* (2013.01); *B29D 11/00442* (2013.01);
(Continued)

(58) Field of Classification Search
CPC ......... H01L 22/00; H01L 22/12; H01L 22/34; H01L 22/26; H01L 23/544; H01L 22/32; H01L 22/14; H01L 2924/01079; H01L 2924/14; H01L 2924/01013; H01L 2224/48091; H01L 2924/01078; G01R 31/2884
See application file for complete search history.

(56) References Cited

U.S. PATENT DOCUMENTS 7,535,646 B2    5/2009  Chari et al.
2004/0189185 A1  9/2004  Yotsuya
(Continued)

FOREIGN PATENT DOCUMENTS

JP  2004-241130 A  8/2004
JP  2009-032463 A  2/2009

OTHER PUBLICATIONS

S. Moller, et al., "Improved light out-coupling in organic light emitting diodes employing ordered microlens arrays", Journal of Applied Physics, vol. 91, No. 5, Mar. 1, 2002, pp. 3324-3327.

*Primary Examiner* — Michelle Mandala
(74) *Attorney, Agent, or Firm* — Fitch, Even, Tabin & Flannery LLP

(57) ABSTRACT

A microlens for an organic EL element, which is used by being disposed on a light-emitting surface of the organic EL element, said microlens comprising a cured resin layer having concavities and convexities formed on a surface thereof, wherein when a Fourier-transformed image is obtained by performing two-dimensional fast Fourier transform processing on a concavity and convexity analysis image obtained by analyzing a shape of the concavities and convexities by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 1 $\mu m^{-1}$ or less.

3 Claims, 7 Drawing Sheets

(51) Int. Cl.
*H01L 51/52* (2006.01)
*H01L 51/56* (2006.01)
*B29K 63/00* (2006.01)
*B29K 105/24* (2006.01)

(52) U.S. Cl.
CPC .......... *G02B3/0037* (2013.01); *H01L 51/5275* (2013.01); *H01L 51/56* (2013.04); *B29K 2063/00* (2013.01); *B29K 2105/246* (2013.01)

(56) References Cited

U.S. PATENT DOCUMENTS

| | | |
|---|---|---|
| 2008/0106192 A1 | 5/2008 | Koo et al. |
| 2008/0117519 A1 | 5/2008 | Chari et al. |
| 2008/0186585 A1 | 8/2008 | Mino et al. |
| 2009/0015917 A1* | 1/2009 | Iwamoto et al. .............. 359/462 |
| 2010/0091219 A1 | 4/2010 | Rho et al. |

* cited by examiner

US 9,194,984 B2

MICROLENS FOR ORGANIC EL ELEMENT, ORGANIC EL ELEMENT USING THE SAME, AND MANUFACTURING METHODS THEREOF

CROSS REFERENCE TO RELATED APPLICATION

This application is a Divisional Patent Application of U.S. application Ser. No. 12/881,025, filed Sep. 13, 2010, which claims foreign priority from Japanese Application JP2010-111867, filed May 14, 2010, the complete disclosures of which are incorporated herein by reference.

BACKGROUND OF THE INVENTION

1. Field of the Invention

The present invention relates to a microlens for an organic EL element, an organic EL element using the same, and manufacturing methods thereof.

2. Related Background Art

An organic electroluminescence element (organic EL element) has been used as a self-luminous element for an image display device, such as a display, and for a surface light source. Such an organic EL element is generally prepared by sequentially stacking a transparent electrode serving as an anode, an organic layer, and a metal electrode serving as a cathode on a transparent supporting substrate, such as a glass and a transparent plastic film. In such an organic EL element, by a voltage applied between the transparent electrode and the metal electrode, electrons supplied from the cathode and holes supplied from the anode are recombined at the organic layer. Then, when an exciton thus generated transitions from an excited state to a ground state, EL emission occurs. Light of the EL emission goes through the transparent electrode, and then is extracted to the outside from the transparent supporting substrate side. Here, in order to enhance the efficiency of such light-extraction, the provision of the so-called microlens on a light-extraction surface has conventionally been studied.

For example, Japanese Unexamined Patent Application Publication No. 2004-241130 (Document 1) discloses an organic EL element in which a transparent electrode, an emitting layer formed of an organic electroluminescence material, and a metal electrode are sequentially stacked on one surface of a transparent substrate, and a microlens is provided to the other surface of the transparent substrate. Moreover, Document 1 discloses a method for forming a microlens on the transparent substrate. The method comprises the steps of: fabricating a mold of the microlens by applying polysilicon onto an outer surface of a silica glass plate that is to be the mold, and performing wet-etching on one surface (lower surface) of the silica glass plate for providing holes at positions to be portions in which convex shapes of the lens are formed; molding a resin into a shape of the mold by applying a thermosetting resin with a predetermined thickness onto one surface (upper surface) of a transparent substrate (glass plate), pasting the mold to the resin in a vacuum in such a way that no bubbles are trapped between the mold and the resin, and then curing the resin by irradiation of light such as UV from the other surface (lower surface) side of the transparent substrate; and forming the microlens on the transparent substrate by detaching the mold from the cured resin. Meanwhile, another method for manufacturing a microlens is disclosed by a paper authored by S. Moller et al., "Improved light out-coupling in organic light emitting diodes employing ordered microlens arrays (Document 2)," described on pages 3324 to 3327 of "JOURNAL OF APPLIED PHYSICS, Vol. 91, No. 5" issued in 2002. This method comprises the steps of: forming a mold by performing etching on a layer formed of SiNx on a silicon wafer using photolithography to form a hole pattern, and by then performing wet-etching on the silicon wafer using the layer formed of SiNx as a mask, and then removing the layer formed of SiNx; and forming by use of the mold a microlens formed of polydimethylsiloxane on a glass substrate by filling a precursor of polydimethylsiloxane between the mold and the glass substrate, then curing the precursor, and then detaching the mold. However, organic EL elements comprising the conventional microlens as described in Documents 1 and 2 are not necessarily satisfactory because of a high angle-dependence of an intensity of an emission spectrum, and a great change in chromaticity.

SUMMARY OF THE INVENTION

The present invention has been made in view of the problems of the above-described conventional techniques. An object of the present invention is to provide a microlens for an organic EL element, the microlens having a sufficiently high light-extraction efficiency, being capable of sufficiently reducing the angle-dependence of emitted light, and also being capable of sufficiently reducing the change in chromaticity, as well as to provide an organic EL element using the same, and manufacturing methods thereof.

The present inventors have earnestly studied in order to achieve the above-described object. As a result, the present inventors have found the following fact. Specifically, a cured resin layer having a shape of concavities and convexities formed on a surface thereof is used as a microlens, and the microlens is made to satisfy a condition that when a Fourier-transformed image is obtained by performing two-dimensional fast Fourier transform processing on a concavity and convexity analysis image obtained by analyzing a shape of the concavities and convexities by use of an atomic force microscope, the Fourier-transformed image shows a circular or annular pattern substantially centered at an origin at which an absolute value of wavenumber is $0\ \mu m^{-1}$, and the circular or annular pattern is present within a region where an absolute value of wavenumber is within a range of $1\ \mu m^{-1}$ or less. In such a case, it is possible to obtain a microlens for an organic EL element, the microlens having a sufficiently high light-extraction efficiency, being capable of sufficiently reducing the angle-dependence of emitted light, and also being capable of sufficiently reducing the change in chromaticity. This finding has led to the completion of the present invention.

Specifically, a microlens for an organic EL element of the present invention is a microlens for an organic EL element, which is used by being disposed on a light-emitting surface of the organic EL element, said microlens comprising a cured resin layer having concavities and convexities formed on a surface thereof, wherein when a Fourier-transformed image is obtained by performing two-dimensional fast Fourier transform processing on a concavity and convexity analysis image obtained by analyzing a shape of the concavities and convexities by use of an atomic force microscope, the Fourier-transformed image shows a circular or annular pattern substantially centered at an origin at which an absolute value of wavenumber is $0\ \mu m^{-1}$, and the circular or annular pattern is present within a region where an absolute value of wavenumber is within a range of $1\ \mu m^{-1}$ or less.

In the microlens for an organic EL element of the present invention, an average height of the concavities and convexities is preferably 400 to 1,000 nm.

In the microlens for an organic EL element of the present invention, an average pitch of the concavities and convexities is preferably within a range from 2 to 10 μm.

In the microlens for an organic EL element of the present invention, when intensities of emission spectra are measured at randomly selected measuring points on the surface on which the concavities and convexities are formed, by causing light incident on the cured resin layer to exit from the surface on which the concavities and convexities are formed, a condition represented by the following inequality (1) is preferably satisfied:

$$\Sigma(y(\theta)-y_0(\theta))^2 \leq 0.05 \tag{1}$$

where θ represents eight measuring angles of 0°, 10°, 20°, 30°, 40°, 50°, 60°, and 70°, y(θ) represents values obtained by normalizing measured values of intensities of emission spectra at the angles θ with respect to a measured value of an intensity of an emission spectrum at an angle of 0°, and $y_0(\theta)$ represents values obtained by normalizing theoretical values, determined from a radiation pattern based on the Lambert law, of intensities of emission spectra at the angles θ with respect to a theoretical value, determined from the radiation pattern, of an intensity of an emission spectrum at an angle of 0°.

A method for manufacturing a microlens for an organic EL element of the present invention is a method comprising the steps of:

applying a curable resin onto one surface of a supporting base member, curing the curable resin with a master block being pressed thereto, and thereafter detaching the master block, thereby forming a cured resin layer having concavities and convexities formed on a surface thereof, to obtain a microlens for an organic EL element, said microlens comprising the cured resin layer having concavities and convexities formed on a surface thereof, wherein the microlens for an organic EL element is such that when a Fourier-transformed image is obtained by performing two-dimensional fast Fourier transform processing on a concavity and convexity analysis image obtained by analyzing a shape of the concavities and convexities by use of an atomic force microscope, the Fourier-transformed image shows a circular or annular pattern substantially centered at an origin at which an absolute value of wavenumber is 0 μm$^{-1}$, and the circular or annular pattern is present within a region where an absolute value of wavenumber is within a range of 1 μm$^{-1}$ or less, and said master block being obtained by a method comprising the steps of:

forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film; and attaching a master block material onto the vapor-deposition film, then curing the master block material, and thereafter detaching the cured master block material from the vapor-deposition film, thereby obtaining a master block.

In the method for manufacturing a microlens for an organic EL element of the present invention, the polymer whose volume changes by heat is preferably a silicone-based polymer.

An organic EL element of the present invention is an organic EL element comprising: a transparent supporting substrate; a transparent electrode; an organic layer; and a metal electrode, wherein the microlens for an organic EL element according to claim 1 is stacked on a light-emitting surface of the transparent supporting substrate.

A method for manufacturing an organic EL element is a method for manufacturing an organic EL element, the organic EL element comprising a transparent supporting substrate, a transparent electrode, an organic layer, and a metal electrode, said method comprising a step of stacking the microlens for an organic EL element according to claim 1 on a light-emitting surface of the transparent supporting substrate.

Note that, it is not known exactly why the above-described object can be achieved by the present invention. However, the present inventors speculate as follows. Specifically, in the present invention, the cured resin layer having the shape of the concavities and convexities formed on the surface thereof is used as a micro lens, and when a Fourier-transformed image is obtained by performing two-dimensional fast Fourier transform processing on a concavity and convexity analysis image obtained by analyzing a shape of the concavities and convexities by use of an atomic force microscope, the Fourier-transformed image shows a circular or annular pattern substantially centered at an origin at which an absolute value of wavenumber is 0 μm$^{-1}$. Such a shape of the concavities and convexities whose Fourier-transformed image shows a circular or annular pattern substantially centered at an origin at which an absolute value of wavenumber is 0 μm$^{-1}$ can be regarded as a shape of concavities and convexities which is isotropic in any cross-sectional direction. For this reason, when the cured resin layer having such concavities and convexities formed thereof is used as a microlens, the light-extraction efficiency can be sufficiently high, because the shape of the concavities and convexities (buckling structure) is isotropic in any cross-sectional direction. Moreover, in such a case it is possible to emit light sufficiently stably at any angle. Accordingly, the present inventors speculate that, as a result of this, it is possible to sufficiently reduce the angle-dependence of emitted light and the change in chromaticity.

According to the present invention, it is possible to provide a microlens for an organic EL element, the microlens having a sufficiently high light-extraction efficiency, being capable of sufficiently reducing the angle-dependence of emitted light, and also being capable of sufficiently reducing the change in chromaticity, as well as to provide an organic EL element using the same, and manufacturing methods thereof.

DETAILED DESCRIPTION OF THE PREFERRED EMBODIMENTS

Figure 1:
FIG. 1 is a cross-sectional view schematically showing a preferred embodiment of a microlens comprising a cured resin layer having concavities and convexities formed on a surface thereof.

Hereinafter, preferred embodiments of the present invention will be described in detail with reference to the drawings. Note that, in the following descriptions and drawings, same or corresponding elements are denoted by same reference numerals, and redundant descriptions will be omitted.

First, a microlens for an organic EL element of the present invention will be described. Specifically, a microlens for an organic EL element of the present invention is a microlens for an organic EL element, which is used by being disposed on a light-emitting surface of the organic EL element, said microlens comprising a cured resin layer having concavities and convexities formed on a surface thereof, wherein when a Fourier-transformed image is obtained by performing two-dimensional fast Fourier transform processing on a concavity and convexity analysis image obtained by analyzing a shape of the concavities and convexities by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 1 $\mu m^{-1}$ or less.

FIG. 1 is a cross-sectional view schematically showing a preferred embodiment of a microlens 11 comprising a cured resin layer having concavities and convexities formed on a surface thereof.

The microlens 11 is used while being stacked on a light-emitting surface of an organic EL element, for the purpose of using the shape of the concavities and convexities on the surface as a microlens structure. The microlens 11 can enhance a light-extraction efficiency from the organic EL element. A material of a cured resin layer forming the microlens 11 is not particularly limited as long as the material can be used for a microlens for an organic EL element. Examples of such a material include curable resins such as epoxy resins, acrylic resins, urethane resins, melamine resins, urea resins, polyester resins, phenol resins, and cross-linking type liquid crystal resins. A thickness of the cured resin layer forming the microlens 11 is preferably within a range from 1 to 500 μm. If the thickness of the cured resin layer forming the microlens 11 is less than the lower limit, heights of the concavities and convexities formed on the surface of the cured resin layer tend to be insufficient. Meanwhile, if the thickness exceeds the upper limit, an effect of volume change of the resin during curing tends to be large, so that the formation of the shape of the concavities and convexities is poor.

In addition, the shape of the concavities and convexities of the cured resin layer forming the microlens 11 needs to satisfy the following condition in the present invention. Specifically, when a Fourier-transformed image is obtained by performing two-dimensional fast Fourier transform processing on a concavity and convexity analysis image obtained by analyzing a shape of the concavities and convexities formed on a surface of the cured resin layer by use of an atomic force microscope, the Fourier-transformed image needs to show a circular or annular pattern substantially centered at an origin at which an absolute value of wavenumber is 0 $\mu m^{-1}$, and the circular or annular pattern needs to be present within a region where an absolute value of wavenumber is within a range of 1 $\mu m^{-1}$ or less. By forming the shape of the concavities and convexities on the surface of the cured resin layer so that such a Fourier-transformed image can satisfy the above-described condition, the shape of the concavities and convexities becomes isotropic in any cross-sectional direction. Under such a situation, when light incident on one surface (the surface in contact with the substrate) side is caused to exit from the surface on which the shape is formed, it is possible to sufficiently reduce the angle-dependence of the emitted light and the change in chromaticity. Note that such a circular or annular pattern is a pattern observed when bright spots in a Fourier-transformed image gather. Hence, the term "circular" herein means that the pattern of the gathering of the bright spots looks like a substantially circular shape, and is a concept including a case where a part of a contour looks like a convex shape or a concave shape. Meanwhile, the term "annular" means that the pattern of the gathering of the bright spots looks like a substantially annular shape, and is a concept including a case where a shape of an outer circle or inner circle of the ring looks like a substantially circular shape and also including a case where a part of the contours of the outer circle or inner circle of the ring looks like a convex shape or a concave shape. Meanwhile, the phrase "the circular or annular pattern is present within a region where an absolute value of wavenumber is within a range of 1 µm$^{-1}$ or less" means that 30% or more (more preferably 50% or more, further more preferably 80% or more, and especially preferably 90% or more) of bright spots forming the annular or annular pattern in the Fourier-transformed image are present within the region where an absolute value of wavenumber is within a range of 10 µm$^{-1}$ or less. Such a shape of the concavities and convexities on the surface of the cured resin layer can be formed efficiently by employing a method using a master block according to the present invention to be described later.

In addition, such a circular or annular pattern is preferably present within a region where an absolute value of wavenumber is within a range from 0.05 to 1 µm$^{-1}$, and more preferably within a region where an absolute value of wavenumber is within a range from 0.1 to 0.5 µm$^{-1}$, from the viewpoint of efficiently refracting or diffracting emitted spectra in the visible region (380 nm to 780 nm). If the circular or annular pattern is not present within the regions where an absolute value of wavenumber is within the ranges, that is, if the number of bright spots which form the circular or annular pattern in the Fourier-transformed image and which are present within the ranges accounts for less than 30% of all bright spots, refraction effective for a lens tends not to be obtained, or a diffraction sufficient for a quasi-diffraction grating tends not to be obtained. In addition, the pattern of the Fourier-transformed image is more preferably annular from the viewpoint that a sufficient effect is obtained on light having wavelengths in the visible region (380 nm to 780 nm).

The Fourier-transformed image can be obtained by analyzing the shape of the concavities and convexities formed on the surface of the cured resin layer by use of an atomic force microscope, thereby obtaining the concavity and convexity analysis image, and then performing two-dimensional fast Fourier transform processing on the concavity and convexity analysis image. Such a concavity and convexity analysis image can be obtained by analysis using anatomic force microscope and employing the following analysis conditions:
Measurement mode: cantilever intermittent contact mode,
Material of cantilever: silicon,
Lever width of cantilever: 40 µm, and
Diameter of tip of cantilever chip: 10 nm.

As the atomic force microscope, commercially available ones can be used as appropriate. For example, a scanning probe microscope equipped with an environment control unit "Nanonavi II Station/E-sweep" manufactured by SII Nano-Technology Inc. can be used. In addition, it is preferable to employ a cantilever intermittent contact mode as the measurement mode of the atomic force microscope. In this respect, when the scanning probe microscope equipped with an environment control unit manufactured by SII NanoTechnology Inc. is used, the dynamic force mode (the DMF mode) may be used. Moreover, as the cantilever, one whose material is silicon, lever width is 40 µm, and diameter of a tip of a cantilever chip is 10 nm as described above may be used, and SI-DF40 may be used, for example. In addition, when the analysis is conducted by use of the above-described atomic force microscope, it is preferable to observe in air and at a temperature of 25° C. the shape of the concavities and convexities formed on the surface of the cured resin layer.

The two-dimensional fast Fourier transform processing on the concavity and convexity analysis image can be easily conducted by electronic image processing using a computer equipped with software for two-dimensional fast Fourier transform processing. In the two-dimensional fast Fourier transform processing, a flattening process including first angle adjustment is preferably performed on the concavity and convexity analysis image.

An average pitch of the concavities and convexities formed on the surface of the cured resin layer is preferably within a range from 2 to 10 µm, and more preferably within a range from 2.5 to 5 µm. If the average pitch of the concavities and convexities is less than the lower limit, not only a diffraction effect as a diffraction grating tends to be stronger than a refraction effect as a lens, so that the light extraction effect is deteriorated, but also the angle-dependence of emitted light tends to be increased, so that sufficient light emission cannot be obtained at some measurement positions. Meanwhile, if the average pitch exceeds the upper limit, a diffraction effect as a diffraction grating tends not to be obtained, so that the characteristics are at the same levels as those of ordinary hemispherical lenses. Note that the average pitch of the concavities and convexities refers to an average value of pitches of the concavities and convexities obtained when pitches of the concavities and convexities on the surface of the cured resin layer (distances between adjacent concave portions or between adjacent convex portions) are measured. As such an average value of pitches of the concavities and convexities, a value which is determined as follows is employed. Specifically, the concavity and convexity analysis image of the shape of the concavities and convexities on the surface are obtained by using a scanning probe microscope (for example, one manufactured by SII NanoTechnology Inc. under the product name of "E-sweep" or the like), then distances between randomly selected adjacent concave portions or between randomly selected adjacent convex portions are measured at ten points or more in the concavity and convexity analysis image, and then an average of these distances is calculated. Moreover, the shape of the concavities and convexities having such a pitch can be formed more efficiently by using a method for manufacturing a microlens for an organic EL element of the present invention to be described later.

In addition, an average height of the concavities and convexities formed on the surface of the cured resin layer is preferably within a range from 400 to 1000 nm, more preferably within a range from 600 to 1000 nm, and further preferably within a range from 700 to 900 nm. If the average height (depth) of the concavities and convexities is less than the lower limit, a refraction effect or a diffraction effect tends not to be obtained sufficiently. Meanwhile, if the average height (depth) exceeds the upper limit, mechanical strength tends to be lowered, so that cracks are more easily formed during production or use. Note that the average height of the concavities and convexities refers to an average value of heights of the concavities and convexities obtained when heights of the concavities and convexities on the surface of the cured resin layer (distances between the concavities and convexities in the depth direction) are measured. As such an average value of heights of the concavities and convexities, a value which is determined as follows is employed. Specifically, the concavity and convexity analysis image of the shape of the concavities and convexities on the surface are obtained by using a scanning probe microscope (for example, one manufactured by SII NanoTechnology Inc. under the product name of "E-sweep" or the like), then distances between the concavities and convexities in the depth direction are measured at ten points or more in the concavity and convexity analysis image, and then an average of these distances is calculated. Moreover, the shape of the concavities and convexities having such a height (depth) can be formed more efficiently by using a method for manufacturing a microlens for an organic EL element of the present invention to be described later.

Moreover, when intensities of emission spectra are measured at randomly selected measuring points P on the surface on which the concavities and convexities are formed, by causing light incident on the cured resin layer from one surface side on which the concavities and convexities are not formed to exit from the surface on which the concavities and convexities are formed, the cured resin layer preferably satisfies the condition represented by the following inequality (1):

$$\Sigma(y(\theta)-y_0(\theta))^2 \leq 0.05 \quad (1)$$

[in the formula, θ represents eight measuring angles of 0°, 10°, 20°, 30°, 40°, 50°, 60°, and 70°, y(θ) represents values obtained by normalizing measured values of intensities of emission spectra at the angles θ with respect to a measured value of an intensity of an emission spectrum at an angle of 0°, and $y_0(\theta)$ represents values obtained by normalizing theoretical values, determined from a radiation pattern based on the Lambert law, of intensities of emission spectra at the angles θ with respect to a theoretical value, determined from the radiation pattern, of an intensity of an emission spectrum at an angle of 0°]. Specifically, a value $[(y(\theta)-y_0(\theta))^2]$ obtainable by squaring a difference between a value (y(θ)) obtained by normalizing a measured value of an intensity of an emission spectrum measured at an angle θ with respect to a measured value of an intensity of an emission spectrum at an angle of 0° and a value ($y_0(\theta)$) obtained by normalizing a theoretical value of an intensity of an emission spectrum at the angle θ based on the Lambert law with respect to a theoretical value of an intensity of an emission spectrum at an angle of 0° based on the Lambert law are determined for each angle θ, and a total sum $(\Sigma(y(\theta)-y_0(\theta))^2)$ of these values is found. In such a case, the total sum is preferably 0.05 or less. If the value of the total sum of the squares of the differences between the normalized values of the measured value and the normalized values of the theoretical value is within the above-described range, the cured resin layer shows a radiation pattern similar to a radiation pattern conforming to the Lambert law. Hence, a cured resin layer having the value of the total sum within the above-described range can be used as a microlens capable of more sufficiently lowering the angle-dependence of the emitted light. Note that the total sum $(\Sigma(y(\theta)-y_0(\theta))^2)$ of the squares of differences between the normalized values of the measured values and the normalized values of the theoretical values is more preferably 0.03 or less, and particularly preferably 0.01 or less because the angle-dependence of the emitted light and the change in chromaticity of the emitted light can be reduced at higher levels.

Figure 2:
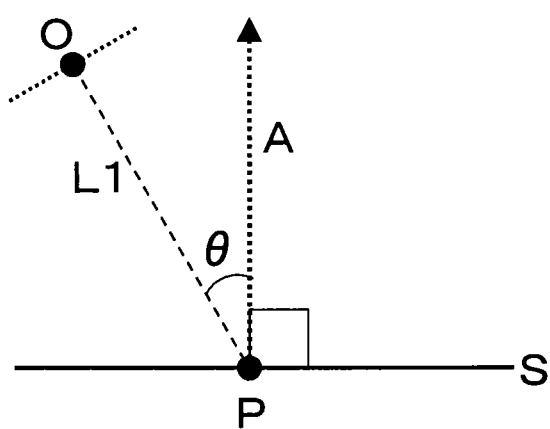
FIG. 2 is a conceptual diagram conceptually showing a measuring angle θ.

Here, description will be made on a method for determining the values (normalized values) obtainable by normalizing measured values of intensities of emission spectra, and the like. For the measurement of such an intensity of an emission spectrum, a publicly known emission spectrum measuring system (for example, one manufactured by Ocean Optics, Inc. under the product name of "USB-2000") capable of measuring an intensity of an emission spectrum can be used as appropriate. As a light source of the light to be incident on the cured resin layer for the purpose of measuring such an intensity of an emission spectrum, an organic layer of an organic EL element can be used by stacking the microlens for an organic EL element of the present invention on a transparent supporting substrate of the organic EL element. Alternatively, a lamp having an emission spectrum in the visible region, such as a xenon lamp, a halogen lamp, a metal halide lamp, a sodium lamp, a mercury lamp, a fluorescent lamp, or a LED lamp, may be used as the light source. Then, spectrum data of light having wavelengths 450 to 700 nm are measured at eight measurement positions at which the measuring angles are 0°, 10°, 20°, 30°, 40°, 50°, 60° and 70°, respectively. Here, a measuring angle in a case where a measurement is conducted in a direction perpendicular to the surface of the cured resin layer is defined as 0°. Then, an actual measurement value (measured value) of an intensity of an emission spectrum is determined from an integral area of the spectrum data at each angle. Thereafter, the actual measurement value (the measured value) of the intensity of the emission spectrum at each angle θ is divided by the actual measurement value (the measured value) of the intensity of the emission spectrum at an angle of 0°, and thereby the actual measurement value is normalized. Thus, the value (y(θ)) which is a normalized measured value of the intensity of the emission spectrum can be determined. Here, the measuring angle θ will be described with reference to FIG. 2. A central portion of a light-receiving surface for receiving emission spectra of an emission spectrum measuring system (light-receiving unit) is referred to as a light-receiving portion O, and a randomly selected measuring point on a surface S of the cured resin layer is referred to as P. In such a case, the measuring angle θ is an angle formed by a line segment PO (line L1) connecting the light-receiving portion O and the measuring point P with respect to a direction which passes through the measuring point P and which is perpendicular to the surface S of the cured resin layer (a direction indicated by the dotted arrow A in FIG. 2, hereinafter, this is simply referred to as a "dotted line A" in some cases). In addition, for the measurement, the spectrum is measured in such a way that the distance between the measuring point P and the light-receiving portion O is 10 cm. As described above, in a case where an angle formed by the dotted line A and a corresponding line L1 (line segment PO) is defined as the measuring angle θ, spectrum data of light having wavelengths 450 to 700 nm are measured at eight measurement positions where the measuring angles are 0°, 10°, 20°, 30°, 40°, 50°, 6 0 °, 70°, and 80°, respectively. On the basis of the obtained spectrum data, an actual measurement value of an intensity of an emission spectrum (a value of integral area of a graph of a spectrum of light having wavelengths of 450 to 700 nm) is determined for each angle. Then, the actual measurement value is divided by an actual measurement value of an intensity of an emission spectrum at an angle of 0°, and thereby the actual measurement value is normalized. Thus, the normalized value (y(θ)) of the intensity of the emission spectrum can be obtained for each angle θ. Note that, in the present invention, a value (y(0)) obtained by normalizing the value of the intensity of the emission spectrum measured at a measuring angle of 0° is 1.0. Meanwhile, the radiation pattern based on the Lambert law refers to a pattern of an angular distribution (the so-called Lambert distribution) of intensities (values of integral areas of graphs of spectra of light having wavelengths of 450 to 700 nm) of emission spectra which can be obtained theoretically from the Lambert law. Then, on the basis of the theoretical angular distribution pattern (radiation pattern) of intensities of the emission spectra obtained based on the Lambert law, theoretical values of intensities of emission spectra at eight positions where the angles θ are 0°, 10°, 20°, 30°, 40°, 50°, 60°, and 70° are normalized with respect to a theoretical value of an intensity of an emission spectrum at an angle of 0°. Thus, a normalized value ($y_0(\theta)$) of the theoretical value of the intensity of the emission spectrum can be determined for each angle θ. Note that, in the present invention, a normalized theoretical value ($y_0(0)$) of the intensity of the emission spectrum at an angle of 0° is 1.0. In addition, a cured resin layer whose total sum of squares of differences between the normalized values (y(θ)) of the measured values and the normalized values ($y_0(\theta)$) of the theoretical values satisfies the condition represented by the above-described inequality (1) can be formed efficiently by using a method for manufacturing a microlens for an organic EL element of the present invention to be described later.

In the microlens for an organic EL element of the present invention, suppose a case where the intensity of an emission spectrum of light having wavelengths of 380 to 780 nm of the microlens is measured by employing a similar method to the above-described method for measuring the intensity of the emission spectrum and the like, and then a CIE xy chromaticity diagram is obtained on the basis of the value of the intensity of the emission spectrum in accordance with JIS-Z8701: 1999 (Method for Specifying Colour—XYZ colour specification system and X10Y10Z10 colour specification system). In such a case, the maximum value of the xy color coordinate distance is preferably 0.05 or less, preferably 0.02 or less, and further preferably 0.01 or less. If the maximum value of distance between xy color coordinates exceeds the upper limit, the viewing angle dependence of the color of the light emission tends to be so great that people can notice the color change when seeing the light emission at various angles. Note that the maximum value of distance between xy color coordinates can be determined by determining a distance $\{(x_\theta-x_0)^2+(y_\theta-y_0)^2\}^{0.5}$ between an xy color coordinate $(x_0, y_0)$ determined from an emission spectrum at an angle of 0° and an xy color coordinate $(x_\theta, y_\theta)$ determined from the emission spectrum for each angle, and then selecting the greatest value from the obtained multiple values of the distances. Moreover, from the viewpoint of being used for white light illumination, the x value and the y value in the CIE xy chromaticity diagram changes preferably within a range where the conditions [0.305<x value<0.325, and 0.320<y value<0.340] are satisfied.

Next, description will be made on a method for manufacturing a microlens for an organic EL element of the present invention. This method for manufacturing a microlens for an organic EL element of the present invention can be suitably used as a method by which the above-described microlens for an organic EL element of the present invention can be manufactured efficiently.

Figure 3:
FIG. 3 is a cross-sectional view schematically showing a state where a curable resin is applied onto a supporting substrate.
Figure 4:
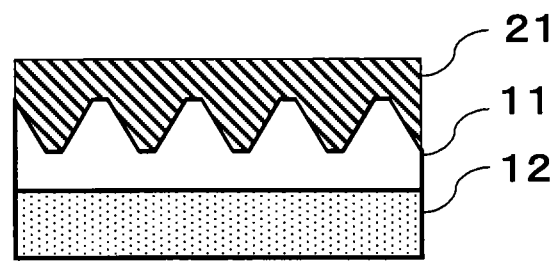
FIG. 4 is a cross-sectional view schematically showing a state where a cured resin layer is formed by curing the curable resin with a master block being pressed thereto.
Figure 5:
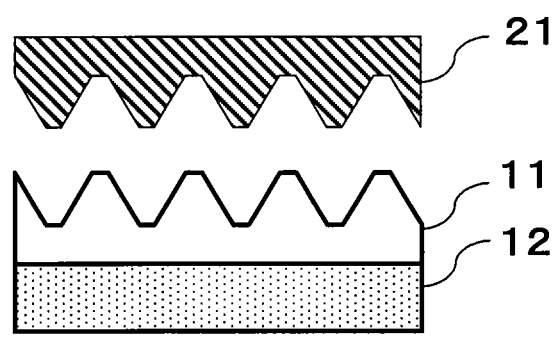
FIG. 5 is a cross-sectional view schematically showing a microlens 11 comprising a cured resin layer having concavities and convexities formed on a surface thereof, the microlens 11 being obtained by detaching the master block 21.

The method for manufacturing a microlens for an organic EL element of the present invention is a method comprising a step of obtaining a microlens for an organic EL element (a step of forming a microlens for an organic EL element), the step comprising: applying a curable resin onto one surface of a supporting base member, curing the curable resin with a master block being pressed thereto, and thereafter detaching the master block, thereby forming a cured resin layer having concavities and convexities formed on a surface thereof, to obtain the microlens, said microlens comprising the cured resin layer having concavities and convexities formed on a surface thereof, wherein when a Fourier-transformed image is obtained by performing two-dimensional fast Fourier transform processing on a concavity and convexity analysis image obtained by analyzing a shape of the concavities and convexities by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 1 $\mu m^{-1}$ or less, and said master block being obtained by a method comprising the steps of:

forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film; and attaching a master block material onto the vapor-deposition film, then curing the master block material, and thereafter detaching the cured master block material from the vapor-deposition film, thereby obtaining a master block. Hereinafter, each step will be described with reference to FIGS. 3 to 5. Note that FIG. 3 is a cross-sectional view schematically showing a state where a curable resin 11' is applied onto a supporting base member 12; FIG. 4 is a cross-sectional view schematically showing a state where a cured resin layer is formed by curing the curable resin 11' with a master block 21 being pressed thereto; and FIG. 5 is a cross-sectional view schematically showing a microlens 11 comprising a cured resin layer having concavities and convexities formed on a surface thereof, the microlens 11 being obtained by detaching the master block 21.

First, the step of forming a microlens for an organic EL element will be described. In the step of forming a microlens for an organic EL element, first, the curable resin 11' is applied onto the supporting base member 12 as shown in FIG. 3, and then the curable resin 11' is cured with the master block 21 being pressed thereto, as shown in FIG. 4.

The curable resin 11' is used to form a cured resin layer by being cured. For this reason, resins similar to those described as curable resin usable as a material for forming the above-described microlens for an organic EL element of the present invention can be used as the curable resin 11'. Meanwhile, as a method for applying the curable resin 11' onto one surface of the supporting base member 12, employable are various coating methods such as a spin coating method, a spray coating method, a dip coating method, a dropping method, a gravure printing method, a screen printing method, a relief printing method, a die coating method, a curtain coating method, an inkjet method, and a sputtering method, for example. The conditions for curing the curable resin 11' cannot be generally specified because the conditions vary depending on the kind of the resin used. However, it is preferable to set a curing temperature within a range from room temperature to 250° C., and a curing time within a range from 0.5 minutes to 3 hours, for example. Alternatively, depending on the kind of the curable resin 11', a method may be employed in which the curable resin 11' is cured by being irradiated with energy rays such as ultraviolet rays or electron beams. In such a case, the amount of the irradiation of the ultraviolet rays or the electron beams is preferably within a range from 20 mJ/cm² to 5 J/cm².

Meanwhile, the supporting base member 12 is not particularly limited, as long as the supporting base member 12 allows the curable resin 11' to be applied thereonto, and can support the curable resin 11'. A publicly known base member (for example, a glass base member, or the like) can be used as appropriate as the supporting base member 12. A transparent supporting substrate for an organic EL element to be described later can be used preferably as the supporting base member 12. When a transparent supporting substrate is used as the supporting base member 12 as described above, an organic EL element can be manufactured without peeling-off of the microlens 11 (cured resin layer) from the supporting base member 12. Hence, the step of manufacturing an organic EL element can be simplified. Meanwhile, the thickness of the supporting base member 12 is not particularly limited. However, the thickness of the supporting base member 12 is preferably within a range from 1 to 500 μm.

In the step of forming a microlens for an organic EL element, subsequently, the master block 21 is detached from the cured resin layer 11 as shown in FIG. 5. Thus, a microlens 11 comprising the cured resin layer is obtained. A method for detaching the master block 21 from the cured resin layer as described above is not particularly limited, and a publicly known method can be employed as appropriate. Thus, the microlens 11 comprising the cured resin layer having concavities and convexities formed thereon can be obtained on the supporting base member 12 (see FIG. 5). Note that, after the microlens 11 is formed as described above, the microlens is peeled off from the supporting base member 12, and then may be used by being stacked on a transparent supporting substrate of an organic EL element. Alternatively, when a transparent supporting substrate is used as the supporting base member 12, an organic EL element may be formed without the peeling-off of the microlens. It is also possible to form in advance a stacked body in which a transparent electrode, an organic layer, and a metal electrode for an organic EL element are formed on one surface of the supporting base member 12, and then to perform the step of forming a microlens for an organic EL element, on the other surface of the supporting base member 12.

Figure 6:
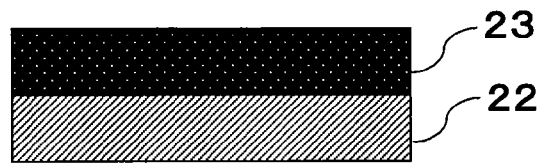
FIG. 6 is a cross-sectional view schematically showing a polymer film before formation of a vapor-deposition film.
Figure 7:
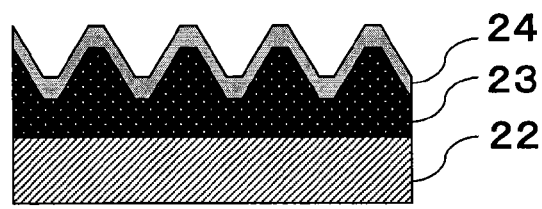
FIG. 7 is a cross-sectional view schematically showing a state where concavities and convexities of wrinkles are formed on a surface of the vapor-deposition film.
Figure 8:
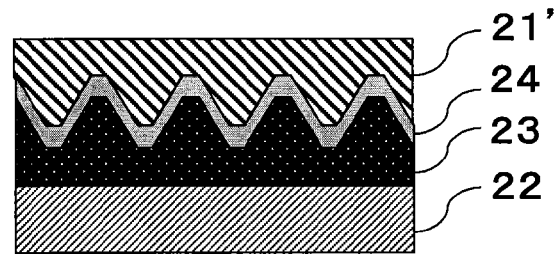
FIG. 8 is a cross-sectional view schematically showing a state where a master block material is attached onto the vapor-deposition film having concavities and convexities formed thereon and then cured.
Figure 9:
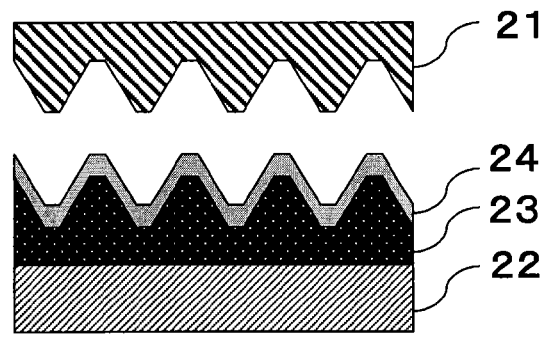
FIG. 9 is a cross-sectional view schematically showing a state where the cured master block is detached from the vapor-deposition film.

Meanwhile, the master block 21 used in the method for manufacturing a microlens for an organic EL element of the present invention needs to be a master block 21 obtained by a method comprising: a step (a concave- and convex-shape formation step) of forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film; and a step (a master block formation step) of attaching a master block material onto the vapor-deposition film, then curing the master block material, and thereafter detaching the cured master block material from the vapor-deposition film, thereby obtaining a master block. Hereinafter, description will be made on a preferred embodiment of a method for manufacturing a master block 21 with reference to FIGS. 6 to 9. Note that FIG. 6 is a cross-sectional view schematically showing a state of a polymer film 23 before formation of the vapor-deposition film; FIG. 7 is a cross-sectional view schematically showing a state where concavities and convexities of wrinkles are formed on a surface of a vapor-deposition film 24, by forming the vapor-deposition film 24 on the polymer film 23, and cooling the polymer film 23 and the vapor-deposition film 24; FIG. 8 is a cross-sectional view schematically showing a state where a master block material is attached onto the vapor-deposition film 24 having concavities and convexities formed thereon and then cured; and FIG. 9 is a cross-sectional view schematically showing a state where the cured master block 21 is detached from the vapor-deposition film 24.

First, the concave- and convex-shape formation step will be described. In the concave- and convex-shape formation step, first, a polymer film 23 made of a polymer whose volume changes by heat is prepared. As the polymer whose volume changes by heat, one whose volume changes by heating or cooling (for example, one having a coefficient of thermal expansion of 50 ppm/K or more) can be used as appropriate. As the polymer, a silicone-based polymer is more preferable, and a silicone-based polymer containing polydimethylsiloxane is particularly preferable, from the viewpoint that the concavities and convexities of wrinkles are easily formed on the surface of the vapor-deposition film 24, because the difference between the coefficient of thermal expansion of the polymer and the coefficient of thermal expansion of the vapor-deposition film 24 is large, and because the polymer has a high flexibility. Moreover, a method for forming the polymer film 23 is not particularly limited. For example, as the method for forming the polymer film 23, a method in which the polymer is applied onto a substrate 22, which is capable of supporting the polymer film, for formation of a polymer film by employing, for example, a spin coating method, a dip coating method, a dropping method, a gravure printing method, a screen printing method, a relief printing method, a die coating method, a curtain coating method, an inkjet method, a spray coating method, a sputtering method, a vapor deposition method, or the like can be employed. Note that the substrate 22 for formation of polymer film is not particularly limited, and a publicly known substrate (a glass substrate or the like) usable for formation of a polymer film can be used as appropriate. In addition, the thickness of the thus formed polymer film 23 is preferably within a range from 10 to 5000 μm, and more preferably within a range from 10 to 2000 μm. Note that, in this embodiment, the polymer film 23 is used while being kept stacked on the substrate 22, but the polymer film 23 may be used after detached from the substrate 22.

In addition, in the concave- and convex-shape formation step, after the polymer film 23 is prepared, a vapor-deposition film 24 is formed on a surface of the polymer film 23 under a temperature condition of 70° C. or above as described above. The temperature at which the vapor-deposition film 24 is formed needs to be 70° C. or above, and more preferably 90° C. or above. If the temperature is lower than 70° C., the concavities and convexities of the wrinkles cannot be formed sufficiently on the surface of the vapor-deposition film. As the method for forming the vapor-deposition film 24, a publicly known method such as a vapor deposition method or a sputtering method can be employed as appropriate. Of these methods, a vapor deposition method is preferably employed from the viewpoint of maintaining the shape of concavities and convexities formed on the surface of the polymer film. Meanwhile, a material of the vapor-deposition film 24 is not particularly limited, and examples thereof include metals such as aluminum, gold, silver, platinum, and nickel, and metal oxides such as aluminum oxide.

Further, in the concave- and convex-shape formation step, after the vapor-deposition film 24 is formed on the surface of the polymer film 23 as described above, concavities and convexities of wrinkles are formed on the surface of the vapor-deposition film 24 by cooling the polymer film 23 and the vapor-deposition film 24 (see FIG. 7). When the vapor-deposition film 24 is formed on the polymer film 23, and then the polymer film 23 and the vapor-deposition film 24 are cooled as described above, the volume of each of the polymer film 23 and the vapor-deposition film 24 changes. However, since there is a difference between the coefficient of thermal expansion of the material forming the polymer film 23 and the coefficient of thermal expansion of the material forming the vapor-deposition film 24, degrees of change in volume of the layers differ from each other. As a result, the concavities and convexities (the so-called bucking pattern, or the so-called Turing pattern) of wrinkles are formed on the surface of the vapor-deposition film 24 as shown in FIG. 7. Here, the temperatures of the polymer film 23 and the vapor-deposition film 24 after the cooling are preferably 40° C. or below. If the temperatures of the polymer film 23 and the vapor-deposition film 24 after the cooling exceed the upper limit, the formation of the concavities and convexities of wrinkles on the surface the vapor-deposition film tends to be less likely to occur. Moreover, the rate of temperature drop in cooling the polymer film 23 and the vapor-deposition film 24 is preferably within a range from 1 to 80° C./minute. If the rate of temperature drop is less than the lower limit, the concavities and convexities tend to be relaxed. Meanwhile, if the rate of temperature drop exceeds the upper limit, scars such as cracks tend to be easily formed on the surfaces of the polymer film and the vapor-deposition film.

Next, the master block formation step will be described. In the master block formation step, first, a master block material 21' is attached to the surface (the surface having the shape of concavities and convexities) of the vapor-deposition film 24 prepared by performing the concave- and convex-shape formation step (see FIG. 8).

The master block material 21' is not particularly limited as long as a master block obtained from the master block material 21' can maintain a strength, a hardness, and the like enough to be used as a mold having a shape of concavities and convexities. Examples of the master block material 21' include inorganic substances such as nickel, silicon, silicon carbide, tantalum, glassy carbon, silica glass, and silica; and resin compositions such as silicone-based polymers (silicone rubbers), urethane rubbers, norbornene resins, polycarbonate, polyethylene terephthalate, polystyrene, polymethyl methacrylate, acrylic, liquid crystal polymers. Of these master block materials 21', silicone-based polymers, nickel, silicon, silicon carbide, tantalum, glassy carbon, silica glass, and silica are more preferable, silicone-based polymers are furthermore preferable, and silicone-based polymers containing polydimethylsiloxane are particularly preferable, from the viewpoints of formability, followability to a fine pattern, and mold releasability.

Meanwhile, as described above, a method for attaching as described above the master block material 21' to the surface, of the vapor-deposition film 24, having the shape of concavities and convexities is not particularly limited. Employable are various coating methods such as a vapor deposition method, a spin coating method, a spray coating method, a dip coating method, a dropping method, a gravure printing method, a screen printing method, a relief printing method, a die coating method, a curtain coating method, an inkjet method, and a sputtering method, for example.

In the master block formation step, after the master block material 21' is attached onto the surface of the vapor-deposition film 24 as described above, the master block material 21' is cured. Conditions for curing the master block material 21' cannot be generally specified because the conditions vary depending on the kind of the master block material used. However, it is preferable to set a curing temperature within a range from room temperature to 250° C., and a curing time within a range from 0.5 minutes to 3 hours, for example. Alternatively, depending on the kind of the master block material 21', a method may be employed in which the master block material 21' is cured by being irradiated with energy rays such as ultraviolet rays or electron beams. In such a case, the amount of the irradiation is preferably within a range from 20 mJ/cm$^2$ to 10 J/cm$^2$.

In the master block formation step, after the master block material 21' on the surface of the vapor-deposition film 24 is cured as described above, the cured master block material 21 is detached from the vapor-deposition film 24 as shown in FIG. 9. Thus, a master block 21 is obtained. A method for detaching the master block 21 from the vapor-deposition film 24 is not particularly limited, and a publicly known method can be employed as appropriate.

Moreover, in the method for manufacturing the master block 21, it is preferable to perform the following steps after the master block (first master block) is obtained in the master block formation step, from the viewpoint of obtaining a master block capable of more efficiently forming a shape of concavities and convexities having an average pitch of 2 to 10 μm and having an average height of 400 to 1000 nm on the obtained cured resin layer. Specifically, the above-described steps include:

a first step of obtaining a first concave and convex resin film having concavities and convexities formed on a supporting base member, by applying a curable resin onto one surface of the supporting base member, curing the curable resin with the master block being pressed thereto, and then detaching the master block;

a second step of obtaining a second polymer film having concavities and convexities formed on a surface thereof, by applying a polymer whose volume changes by heat onto a surface of the first concave and convex resin film, curing the applied polymer, and then detaching the cured polymer film;

a third step of obtaining a stacked body by forming under a temperature condition of 70° C. or above a vapor-deposition film on the surface of the second polymer film on which the concavities and convexities are formed, and then cooling the polymer film and the vapor-deposition film, thereby forming concavities and convexities of wrinkles on a surface of the vapor-deposition film;

a fourth step of obtaining a second concave and convex resin film having concavities and convexities formed on a different supporting base member, by obtaining a coating film by applying a curable resin onto one surface of the different supporting base member, then curing the curable resin with the concave and convex surface of the stacked body being pressed to the coating film, and detaching the stacked body therefrom; and a fifth step of obtaining a master block by attaching a master block material onto the second concave and convex resin film, then curing the master block material, and thereafter detaching the cured master block material from the vapor-deposition film. Moreover, since it is made possible to manufacture a master block capable of more efficiently manufacturing a cured resin layer satisfying the condition represented by the above-described inequality (1), the first to fifth steps may be conducted repeatedly by use of the master block obtained in the fifth step, or, after the first to fifth steps are conducted, only the third to fifth steps may be repeatedly conducted by use of the concave and convex surface of the master block obtained in the fifth step as the surface having concavities and convexities described in the third step. When a master block in which the shape of the concavities and convexities formed in the first master block is duplicated in the sequential manner is manufactured by repeatedly conducting the first to fifth steps as described above, or by repeatedly conducting a part of the steps after the first to fifth steps are conducted, the wrinkles can be deeper every time the vapor deposition step is repeated. As a result, the average height of the concavities and convexities formed on the surface of the master block can be increased. Then, by using the master block having concavities and convexities whose average height is increased as a master block for forming a microlens, a microlens having higher performances can be formed. Note that, depending on an intended design of the shape of the concavities and convexities (pitch and height (depth) of the concavities and convexities), the kind of the material used, and the like, it is possible to change as appropriate the number of repetitions of the steps of duplicating the shape of concavities and convexities formed in the first master block (for example, the above-described first to fifth steps), the kinds of steps repeatedly conducted, and the like.

As the first master block, the supporting base member, the curable resin, and the polymer whose volume changes by heat which are used in the first and second steps, those similar to those described for the aforementioned concave- and convex-shape formation step or the aforementioned master block formation step can be used. As application methods thereof, curing methods thereof, and the like, similar methods can also be employed. In addition, the third step is a step similar to that described as the aforementioned concave and convex shape formation step, except that the polymer film obtained in the second step is used. In addition, as the curable resin and the master block material used in the fourth and fifth steps, those similar to those described for the aforementioned master block formation step or the like can be used. Meanwhile, as application methods thereof and the like, methods similar to the methods described for the aforementioned master block formation step or the like can be used.

When a polymer whose volume changes by heat is used as the master block material in the method for manufacturing a master block 21, the concave- and convex-shape formation step and the master block formation step may be repeated by use of the obtained master block as the polymer film. This method also makes it possible to deepen the wrinkles formed on the surface of the master block, and to increase the average height of concavities and convexities formed on the surface of the master block.

Next, an organic EL element of the present invention will be described. Specifically, the organic EL element of the present invention is an organic EL element comprising a transparent supporting substrate, a transparent electrode, an organic layer, and a metal electrode, wherein the microlens for an organic EL element of the present invention is stacked on a light-emitting surface of the transparent supporting substrate. Hereinafter, a preferred embodiment of the organic EL element of the present invention will be described with reference to FIG. 10.

Figure 10:
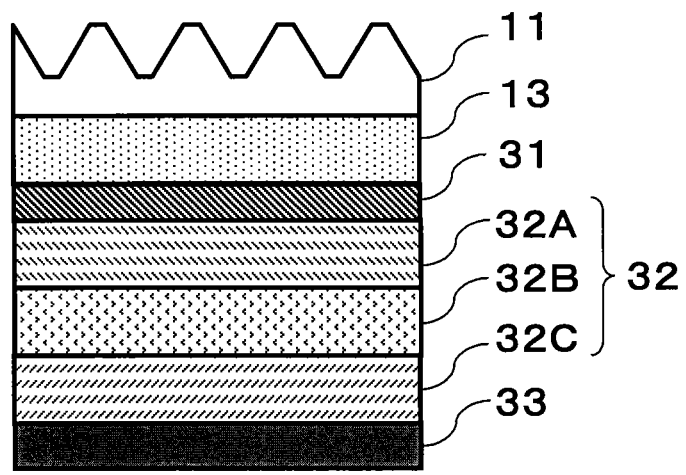
FIG. 10 is a schematic lateral cross-sectional view showing a preferred embodiment of an organic EL element of the present invention.

FIG. 10 is a schematic lateral cross-sectional view showing a preferred embodiment of the organic EL element of the present invention. The organic EL element shown in FIG. 10 comprises: a transparent supporting substrate 13; a microlens 11 stacked on one surface of the transparent supporting substrate 13; and a transparent electrode 31, an organic layer 32, and a metal electrode 33, which are sequentially stacked on the other surface of the transparent supporting substrate 13, on which surface the microlens is not formed.

The transparent supporting substrate 13 is not particularly limited, as long as the transparent supporting substrate 13 can be used as a transparent supporting substrate for an organic EL element. Examples of the transparent supporting substrate 13 include: base members made of a transparent inorganic material such as glass; base members made of a resin such as polyethylene terephthalate (PET), polyethylene terenaphthalate (PEN), polycarbonate (PC), cycloolefin polymer (COP), polymethyl methacrylate (PMMA), or polystyrene (PS); stacked base members having a gas barrier layer made of an inorganic substance such as SiN, SiO2, SiC, SiOxNy, TiO2, and Al2O3 formed on a surface of a base member made of any of the above-described resins; and stacked base members having base members made of any of the above-described resins and gas barrier layers made of any of the above-described inorganic substances stacked alternately on each other. Meanwhile, the thickness of the transparent supporting substrate 13 is not particularly limited. However, the thickness of the transparent supporting substrate 13 is preferably within a range from 1 to 5000 μm.

The microlens 11 stacked on the one surface of the transparent supporting substrate 13 is the above-described microlens for an organic EL element of the present invention. As described above, the organic EL element of the present invention comprises, on a light-emitting surface thereof, the microlens comprising the cured resin layer having the above-described shape of concavities and convexities (the shape of concavities and convexities such that when a Fourier-transformed image is obtained by performing two-dimensional fast Fourier trans form processing on a concavity and convexity analysis image obtained by analyzing the shape of the concavities and convexities by use of an atomic force microscope, the Fourier-transformed image shows a circular or annular pattern substantially centered at an origin at which an absolute value of wavenumber is 0 $\mu m^{-1}$, and the circular or annular pattern is present within a region where an absolute value of wavenumber is within a range of 1 $\mu m^{-1}$ or less). Hence, the angle-dependence of light emitted from the organic EL element can be sufficiently reduced. For example, it is possible to achieve such light emission that the condition represented by the above-described inequality (1) is satisfied and hence the angle-dependence thereof is extremely low.

A material of the transparent electrode 31 is not particularly limited, as long as the material is usable for a transparent electrode of an organic EL element. For example, indium oxide, zinc oxide, tin oxide, indium-tin-oxide (ITO), which is a composite material thereof, gold, platinum, silver, or copper is used as the material. Of these materials, ITO is preferable from the viewpoint of balance between transparency and electrical conductivity. In addition, the thickness of the transparent electrode 31 is preferably within a range from 20 to 500 nm. If the thickness is less than the lower limit, the electrical conductivity tends to be insufficient. Meanwhile, if the thickness exceeds the upper limit, transparency tends to be so insufficient that the emitted EL light cannot be extracted to the outside sufficiently.

The organic layer 32 may be any as long as the organic EL element can be formed. In the embodiment shown in FIG. 10, a stacked body of a hole transporting layer 32A, an emitting layer 32B, and an electron transporting layer 32C is used as the organic layer. Here, as a material of the hole transporting layer 32A, a publicly known material from which the hole transporting layer 32A can be formed (for example, derivatives of: triphenylamine, triphenyldiamine derivative (TPD), benzidine, pyrazoline, styrylamine, hydrazone, triphenylmethane, carbazole, or the like) can be used as appropriate. Meanwhile, the emitting layer 32B is a layer in which electrons and holes injected through electrode layers or the like recombine to emit light. A material of such an emitting layer 32B is not particularly limited, and a publicly known material from which an emitting layer of an organic EL element can be formed (for example, 8-hydroxyquinoline aluminum ($Alq_3$, green, low-molecular weight), bis-(8-hydroxy)quinaldine aluminum phenoxide ($Alq'_2OPh$, blue, low-molecular weight), 5,10,15,20-tetraphenyl-21H,23H-porphine (TPP, red, low-molecular weight), poly(9,9-dioctylfluorene-2,7-diyl) (PFO, blue, high-molecular weight), or poly[2-methoxy-5-(2'-ethylhexyloxy)-1,4-(1-cyanovinylene)phenylene] (MEH-CN-PPV, red, high-molecular weight)) can be used as appropriate. Moreover, a material of the electron transporting layer 32C is not particularly limited, and a publicly known material from which the electron transporting layer 32C can be formed (for example, an aluminum quinolinol complex (Alq), a phenanthroline derivative, an oxadiazole derivative, a triazole derivative, a phenylquinoxaline derivative, or a silole derivative) can be used as appropriate.

When the organic layer 32 is a stacked body comprising the hole transporting layer 32A, the emitting layer 32B, and the electron transporting layer 32C, the thicknesses of the hole transporting layer 32A, the emitting layer 32B, and the electron transporting layer 32C are preferably within a range from 1 to 50 nm, within a range from 5 to 200 nm, and within a range from 5 to 200 nm, respectively, but not particularly limited thereto.

A material of the metal electrode 33 is not particularly limited, and a material having a small work function can be used as appropriate. Examples of the material include aluminum, MgAg, MgIn, and AlLi. Meanwhile, the thickness of the metal electrode 33 is preferably within a range from 50 to 500 nm. If the thickness is less than the lower limit, the electrical conductivity tends to decrease. Meanwhile, if the thickness exceeds the upper limit, peeling-off and cracks tend to more easily occur.

The preferred embodiment of the organic EL element of the present invention has been described above. Hoverer, the organic EL element of the present invention is not limited to the above-described embodiment. For example, in the above-described embodiment, the organic layer 32 comprises the stacked body of the hole transporting layer 32A, the emitting layer 32B, and the electron transporting layer 32C. However, the form of the organic layer is not particularly limited. For example, the organic layer may be an organic layer comprising a stacked body of a hole injecting layer and an emitting layer; an organic layer comprising a stacked body of an emitting layer and an electron injecting layer; an organic layer comprising a stacked body of a hole injecting layer, an emitting layer, and an electron injecting layer; an organic layer comprising a stacked body of a buffer layer, a hole transporting layer, and an electron transporting layer; or the like. Note that a material of each layer in the alternative forms of such an organic layer is not particularly limited, and a publicly known material can be used as the material as appropriate. For example, as the material of the electron injecting layer, a perylene derivative or the like may be used. As the material of the hole injecting layer, a triphenylamine derivative or the like may be used. As the material of an anode buffer layer, copper phthalocyanine, PEDOT, or the like may be used. Layers which are not provided in the case of the above-described embodiment may be provided as appropriate as long as the layers can be used in an organic EL element. For example, from the viewpoint of facilitating charge injection or hole injection into the organic layer 32, a layer made of a metal fluoride such as lithium fluoride (LiF), or $Li_2O_3$, a highly active alkaline earth metal such as Ca, Ba, or Cs, an organic insulating material, or the like may be provided on the transparent electrode 31 or the organic layer 32.

The organic EL element of the present invention has been described above. Next, a method for manufacturing an organic EL element of the present invention will be described. The method for manufacturing an organic EL element of the present invention is capable of suitably manufacturing the organic EL element of the present invention. The method for manufacturing an organic EL element of the present invention is a method for manufacturing an organic EL element, the organic EL element comprising a transparent supporting substrate, a transparent electrode, an organic layer, and a metal electrode, said method comprising a step of stacking the aforementioned microlens for an organic EL element of the present invention on a light-emitting surface of the transparent supporting substrate.

The microlens used in the method for manufacturing an organic EL element can be manufactured by utilizing the above-described method for manufacturing a microlens for an organic EL element of the present invention. When the above-described method for manufacturing a microlens for an organic EL element of the present invention is used for manufacturing the microlens for an organic EL element of the present invention, the step of stacking the microlens for an organic EL element of the present invention on a light-emitting surface of the transparent supporting substrate may be a step in which a microlens 11 is manufactured by use of a supporting base member 12 as described above, then the microlens 11 is peeled off from the supporting base member 12, and the microlens 11 is stacked on a transparent supporting substrate of the organic EL element. Meanwhile, when a transparent supporting substrate 13 is used as the supporting base member 12 in utilizing the method for manufacturing a microlens for an organic EL element of the present invention, the step of stacking the microlens for an organic EL element of the present invention on the light-emitting surface of the transparent supporting substrate may be a step in which the microlens for an organic EL element of the present invention is manufactured on the transparent supporting substrate. When the transparent supporting substrate 13 is used as the supporting base member 12 as described above, an organic EL element can be formed without the peeling-off of the microlens 11 from the transparent supporting substrate 13. Hence, an organic EL element can be manufactured more efficiently. The step of stacking the microlens for an organic EL element of the present invention on the light-emitting surface of the transparent supporting substrate may be a step in which the transparent supporting substrate 13 is used as the supporting base member 12, a transparent electrode, an organic layer, and a metal electrode for an organic EL element are stacked in advance on one surface of the transparent supporting substrate 13, and then the method for manufacturing a microlens for an organic EL element of the present invention is performed on the other surface of the transparent supporting substrate 13.

When a method for peeling off the microlens from the supporting base member is used in the step of stacking the microlens for an organic EL element, the method for the peeling-off is not particularly limited, as long as the method enables the microlens to be peeled off from the base member while maintaining the shape of concavities and convexities formed on the microlens. For example, a peeling-off method using tweezers may be employed. Meanwhile, a method for stacking the peeled-off microlens on the transparent supporting substrate is not particularly limited as long as the method enables the microlens to be stacked thereon. For example, it is possible to use a method for stacking the microlens on the transparent supporting substrate by use of an adhesive material, a method for stacking the microlens on the transparent supporting substrate by use of a sticky agent, or the like. As such an adhesive material, a publicly known material capable of causing the cured resin layer (the microlens) to adhere onto the transparent supporting substrate can be used as appropriate. For example, an UV-curable optical adhesive NOA60, NOA61, NOA71, NOA72, or NOA81 manufactured by Norland Products Inc. or UV-3400 manufactured by TOAGOSEI CO., LTD. can be used. A method for applying the adhesive material is not particularly limited. As the method for applying the adhesive material, a publicly known method can be employed as appropriate. Note that the adhesive material may be applied onto either the transparent supporting substrate or the microlens. In the method for manufacturing an organic EL element of the present invention, the step of stacking the organic layer and the like may be carried out first, or the step of stacking a microlens may be carried out first.

A step of forming the transparent electrode, the organic layer, and the metal electrode in the organic EL element is not particularly limited, and a publicly known method can be used as appropriate. For example, this step may be a step in which the transparent electrode, the organic layer, and the metal electrode are sequentially stacked on the other surface (a surface on which the microlens 11 is not stacked) of the transparent supporting substrate (hereinafter, this step is simply referred to as an "organic EL element formation step).

In the organic EL element formation step, first, the transparent electrode is stacked on the other surface (the surface on which the microlens is not formed) of the transparent supporting substrate 13. As a material of the transparent electrode 31, one similar to that of the transparent electrode 31 described for the organic EL element of the present invention may be used. As a method for stacking the transparent electrode 31, a publicly known method such as a vapor deposition method or a sputtering method can be employed as appropriate. Of these methods, a sputtering method is preferably employed from the viewpoint of forming a dense film.

In the organic EL element formation step, next, the organic layer 32 is stacked on a surface of the transparent electrode 31. The organic layer 32 may have a structure similar to any of the organic layers which is described as organic layers usable as the organic layer in the organic EL element of the present invention. As a material thereof, one similar to that described for the organic EL element of the present invention can be used as appropriate. For example, when the organic layer is the stacked body comprising the hole transporting layer 32A, the emitting layer 32B, and the electron transporting layer 32C as shown in FIG. 10, these layers may be sequentially stacked on the transparent electrode 31. Note that a method for stacking each layer in the organic layer 32 is not particularly limited, and a publicly known method can be used as appropriate. For example, a vapor deposition method, a sputtering method, an application method, or the like may be employed. Of these methods, the vapor deposition method is preferably employed, from the viewpoints of sufficiently preventing decomposition, degradation, and denaturation of the organic layers.

In the organic EL element formation step, thereafter, the metal electrode 33 is stacked on the organic layer 32. As a material of the metal electrode 33, one similar to that of the metal electrode 33 for the organic EL element of the present invention may be used. Moreover, a method for stacking the metal electrode 33 is not particularly limited, and a publicly known method can be used as appropriate. For example, a vapor deposition method, a sputtering method, or the like may be employed. Of these methods, the vapor deposition method is preferably employed, from the viewpoints of sufficiently preventing decomposition, degradation, and denaturation of the organic layers 32 previously formed.

EXAMPLES

Hereinafter, the present invention will be described more specifically on the basis of Examples and Comparative Examples. However, the present invention is not limited to Examples below.

Example 1

Step of Forming Master Block

First, a silicone-based polymer (a mixed resin composition containing 90% by mass of a silicone rubber [manufactured by Wacker Chemie AG under the product name of "Elastosil RT601A"] and 10% by mass of a curing agent [manufactured by Wacker Chemie AG under the product name of "Elastosil RT601B"]) was applied onto a base member (material: glass, thickness: 1.1 mm, size: 17×13 mm) by a spin coating method so as to achieve a thickness after the application of 22.5 μm.

Then, the silicone-based polymer was cured by being heated at 100° C. for one hour. Thus, a first silicone-based polymer film was formed.

Next, the base member on which the first silicone-based polymer film is formed was placed in a vacuum chamber, and a first aluminum vapor-deposition film (thickness: 100 nm) was formed on the first silicone-based polymer film by a vapor deposition method under conditions of a temperature of 80° C. and a pressure of $1 \times 10^{-3}$ Pa. Thus, a first stacked body in which the first aluminum vapor-deposition film was formed on the first silicone-based polymer film was obtained. Then, the first stacked body was cooled in a vacuum chamber to room temperature (25° C.) over one hour. Thereafter, the pressure inside the vacuum chamber was set back to the atmospheric pressure ($1.013 \times 10^5$ Pa). By cooling the first stacked body as described above, concavities and convexities were formed on a surface of the first aluminum vapor-deposition film formed on the first silicone-based polymer film.

Subsequently, a silicone-based polymer (a mixed resin composition containing 90% by mass of a silicone rubber [manufactured by Wacker Chemie AG under the product name of "Elastosil RT601A"] and 10% by mass of a curing agent [manufactured by Wacker Chemie AG under the product name of "Elastosil RT601B"]) was applied onto the first aluminum vapor-deposition film by a dropping method so as to achieve a thickness after the application of 1.5 mm, and then cured by being heated in an oven at 60° C. for 2 hours. Thereafter, the cured silicone-based polymer was detached from the first aluminum vapor-deposition film, so that a first master block (M-1) was obtained.

Next, another base member (material: glass, thickness: 1.1 mm, size: 17×13 mm) was prepared. Then, a coating film was formed by applying an ultraviolet ray-curable epoxy resin (manufactured by Norland under the product name of "NOA81") onto the base member by a dropping method so as to achieve a thickness after the application of 100 μm. Thereafter, a surface of the coating film was irradiated with ultraviolet rays for ten minutes with the first master block (M-1) being pressed thereto, so that the ultraviolet ray-curable epoxy resin was cured. Then, the first master block (M-1) was detached. Thus, a first epoxy resin film was obtained. The first epoxy resin film had concavities and convexities which were formed on the surface thereof and which were originated from the shape of the concavities and convexities of the first master block (M-1).

Subsequently, a silicone-based polymer (a mixed resin composition containing 90% by mass of a silicone rubber [manufactured by Wacker Chemie AG under the product name of "Elastosil RT601A"] and 10% by mass of a curing agent [manufactured by Wacker Chemie AG under the product name of "Elastosil RT601B"]) was applied onto the first epoxy resin film by a dropping method so as to achieve a thickness after the application of 1.5 mm, and then cured by being heated in an oven at 60° C. for 2 hours. Thereafter, the cured silicone-based polymer was detached from the first epoxy resin film. Thus, a second silicone-based polymer film was obtained. The second silicone-based polymer film had concavities and convexities which were formed on a surface thereof and which were originated from the shape of the concavities and convexities of the first epoxy resin film. (Note that, as is apparent from the manufacturing method of the second silicone-based polymer film, the shape of the concavities and convexities of the first master block (M-1) was transferred to the thus obtained second silicone-based polymer film by use of the first epoxy resin film, and hence the second silicone-based polymer film itself can also be used as a master block.)

Next, the second silicone-based polymer film was placed in a vacuum chamber, and a second aluminum vapor-deposition film (thickness: 100 nm) was formed on the surface, having the concavities and convexities formed, of the second silicone-based polymer film by a vapor deposition method under conditions of a temperature of 80° C. and a pressure of $1\times10^{-3}$ Pa. Thus, a second stacked body in which the second aluminum vapor-deposition film was formed on the second silicone-based polymer film was obtained. Then, the second stacked body was cooled in a vacuum chamber to room temperature (25° C.) over one hour. Thereafter, the pressure inside the vacuum chamber was set back to the atmospheric pressure ($1.013\times10^5$ Pa). By cooling the second stacked body as described above, concavities and convexities were formed on a surface of the second aluminum vapor-deposition film formed on the second silicone-based polymer film.

Next, another base member (material: glass, thickness: 1.1 mm, size: 17×13 mm) was prepared. Then, a coating film was formed by applying an ultraviolet ray-curable epoxy resin (manufactured by Norland under the product name of "NOA81") onto the base member by a dropping method so as to achieve a thickness after the application of 100 μm. Thereafter, a surface of the coating film was irradiated with ultraviolet rays for ten minutes with the second stacked body being pressed thereto, so that the ultraviolet ray-curable epoxy resin was cured. Then, the second stacked body was detached. Thus, a second epoxy resin film was obtained. The second epoxy resin film had concavities and convexities which were formed on the surface thereof and which were originated from the shape of the concavities and convexities of the second stacked body.

Subsequently, a silicone-based polymer (a mixed resin composition containing 90% by mass of a silicone rubber [manufactured by Wacker Chemie AG under the product name of "Elastosil RT601A"] and 10% by mass of a curing agent [manufactured by Wacker Chemie AG under the product name of "Elastosil RT601B"]) was applied onto the second epoxy resin film by a dropping method so as to achieve a thickness after the application of 1.5 mm, and then cured by being heated in an oven at 60° C. for 2 hours. Thereafter, the cured silicone-based polymer was detached from the second epoxy resin film. Thus, a third silicone-based polymer film (a second master block (M-2)) was obtained. The third silicone-based polymer film had concavities and convexities which were formed thereon and which were originated from the shape of the concavities and convexities of the second epoxy resin film.

Next, the third silicone-based polymer film was placed in a vacuum chamber, and a third aluminum vapor-deposition film (thickness: 100 nm) was formed on the surface, having the concavities and convexities formed, of the third silicone-based polymer film by a vapor deposition method under conditions of a temperature of 80° C. and a pressure of $1\times10^{-3}$ Pa. Thus, a third stacked body in which the third aluminum vapor-deposition film was formed on the third silicone-based polymer film was obtained. Then, the third stacked body was cooled in a vacuum chamber to room temperature (25° C.) over one hour. Thereafter, the pressure inside the vacuum chamber was set back to the atmospheric pressure ($1.013\times10^5$ Pa). By cooling the third stacked body as described above, concavities and convexities were formed on a surface of the third aluminum vapor-deposition film formed on the third silicone-based polymer film.

Next, another base member (material: glass, thickness: 1.1 mm, size: 17×13 mm) was prepared. Then, a coating film was formed by applying an ultraviolet ray-curable epoxy resin (manufactured by Norland under the product name of "NOA81") onto the base member by a dropping method so as to achieve a thickness after the application of 100 μm. Thereafter, a surface of the coating film was irradiated with ultraviolet rays for ten minutes with the third stacked body being pressed thereto, so that the ultraviolet ray-curable epoxy resin was cured. Then, the third stacked body was detached. Thus, a third epoxy resin film was obtained. The third epoxy resin film had concavities and convexities which were formed on the surface thereof and which were originated from the shape of the concavities and convexities of the third stacked body.

Subsequently, a silicone-based polymer (a mixed resin composition containing 90% by mass of a silicone rubber [manufactured by Wacker Chemie AG under the product name of "Elastosil RT601A"] and 10% by mass of a curing agent [manufactured by Wacker Chemie AG under the product name of "Elastosil RT601B"]) was applied onto the third epoxy resin film by a dropping method so as to achieve a thickness after the application of 1.5 mm, and then cured by being heated in an oven at 60° C. for 2 hours. Thereafter, the cured silicone-based polymer was detached from the third epoxy resin film. Thus, a third master block (M-3) was obtained. The third silicone-based polymer film had concavities and convexities which were formed thereon and which were originated from the shape of the concavities and convexities of the second epoxy resin film.

<Step of Forming Microlens (A)>

A base member (material: glass, thickness: 1.1 mm, size: 17×13 mm) was prepared. Then, a coating film was formed by applying an ultraviolet ray-curable epoxy resin (manufactured by Norland under the product name of "NOA81") onto the base member by a dropping method so as to achieve a thickness after the application of 500 μm. Thereafter, a surface of the coating film was irradiated with ultraviolet rays for ten minutes with the third master block (M-3) being pressed thereto, so that the ultraviolet ray-curable epoxy resin was cured. Then, the third master block (M-3) was detached. Thus, a microlens (A) for an organic EL element was obtained. The microlens (A) was formed of a cured resin film having concavities and convexities which were formed on the surface thereof and which were originated from the shape of the concavities and convexities of the third master block (M-3). Thereafter, the obtained microlens (A) was peeled off from the base member by use of tweezers, while the change of the shape of the concavities and convexities was avoided.

Figure 11:
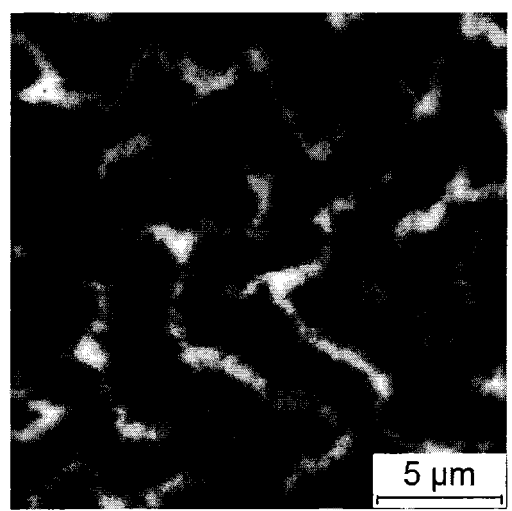
FIG. 11 is a photograph showing a concavity and convexity analysis image in which results of analysis using an atomic force microscope of a surface of a microlens (A) obtained in Example 1 are shown on a display.
Figure 12:
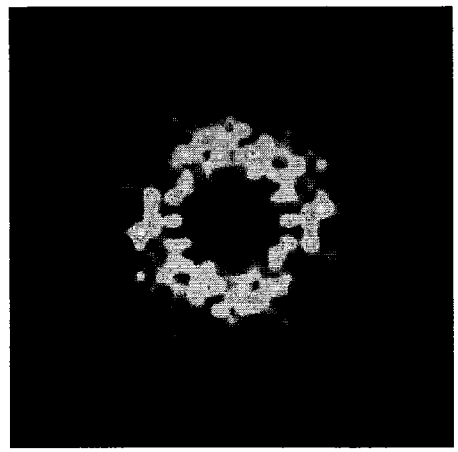
FIG. 12 is a photograph showing a Fourier-transformed image in which results obtained by performing two-dimensional fast Fourier transform processing on the concavity and convexity analysis image of the surface of the microlens (A) obtained in Example 1 are shown on a display, the concavity and convexity analysis image being obtained by using the atomic force microscope.

The shape of the concavities and convexities formed on the surface of the thus obtained microlens (A) was analyzed by use of an atomic force microscope (a scanning probe microscope equipped with an environment control unit "Nanonavi II station/E-sweep" manufactured by SII NanoTechnology Inc.) under the following analysis conditions:
Measurement mode: dynamic force mode
Cantilever: SI-DF40 (material: Si, lever width: 40 μm, diameter of tip of chip: 10 nm)
Measurement atmosphere: in air
Measurement temperature: 25° C. Thus, a concavity and convexity analysis image of the shape was obtained. FIG. 11 shows the obtained concavity and convexity analysis image. Note that the average height of the concavities and convexities formed on the surface of the microlens (A) was 0.84 μm, and the pitch of the concavities and convexities was 3.1 μm. Furthermore, the obtained concavity and convexity analysis image was subjected to a flattening process including first angle adjustment, and then to two-dimensional fast Fourier transform processing. Thus, a Fourier-transformed image was obtained. FIG. 12 shows the obtained Fourier-transformed image. Note that, in the photograph shown in FIG. 12, the length in the longitudinal direction of the photograph corresponds to 1.9 µm$^{-1}$, and the length in the transverse direction corresponds to 1.9 µm$^{-1}$. As is apparent from the results shown in FIG. 12, it was found that the Fourier-transformed image showed an annular pattern substantially centered at an origin at which an absolute value of wavenumber is 0 µm$^{-1}$, and that the annular pattern was such that 90% or more of bright spots among all bright spots forming the Fourier-transformed image are present within a region where an absolute value of wavenumber is within a range from 0.1 to 0.5 µm$^{-1}$.

<Step of Forming Organic EL Element>

A glass substrate (size: 17 mm×13 mm, thickness: 0.14 mm) was prepared. Then, an ultraviolet ray-curable epoxy resin (manufactured by Norland under the product name of "NOA81") was applied onto one surface of the glass substrate by a spin coating method so as to achieve a thickness after the application of 13 µm. Thus, a coating film was formed. Thereafter, a transparent electrode (ITO, thickness: 150 nm), a hole transporting layer (N,N'-diphenyl-N,N'-bis(3-methylphenyl)-1,1'-diphenyl-4,4'-diamine, thickness: 40 nm), an emitting layer (8-hydroxyquinoline aluminum, thickness: 60 nm), a lithium fluoride layer (thickness: 1.5 nm), and a metal electrode 5 (aluminum, thickness: 150 nm) were stacked on each other by vapor deposition methods, and the microlens (A) obtained as described above was stacked on the other surface of the glass substrate by being brought into contact therewith in such a way that no bubbles were trapped therebetween. Thus, an organic EL element of the present invention was obtained.

Comparative Example 1

A glass substrate (size: 17 mm×13 mm, thickness: 0.14 mm) was prepared. Then, an ultraviolet ray-curable epoxy resin (manufactured by Norland under the product name of "NOA81") was applied onto one surface of the glass substrate by a spin coating method so as to achieve a thickness after the application of 13 µm. Thus, a coating film was formed. Thereafter, a transparent electrode (ITO, thickness: 150 nm), a hole transporting layer (N,N'-diphenyl-N,N'-bis(3-methylphenyl)-1,1'-diphenyl-4,4'-diamine, thickness: 40 nm), an emitting layer (8-hydroxyquinoline aluminum, thickness: 60 nm), a lithium fluoride layer (thickness: 1.5 nm), and a metal electrode 5 (aluminum, thickness: 150 nm) were stacked on each other by vapor deposition methods. Thus, an organic EL element for comparison was obtained.

Comparative Example 2

An organic EL element for comparison was obtained in a manner similar to that of Comparative Example 1, except that a microlens (B) for comparison was stacked on the other surface (light-emitting surface) of the glass substrate. Note that a hemispherical lens having a diameter of 5 mm and being manufactured by Edmund Optics Inc. was used as the microlens (B) for comparison. The hemispherical lens was stacked on the glass substrate by use of an uncured ultraviolet ray-curable epoxy resin (manufactured by Norland under the product name of "NOA81") as an adhesive agent.

[Evaluation of Characteristics of Organic EL Elements Obtained in Example 1 and Comparative Examples 1 to 2]

<Evaluation of Angle-Dependence of Light Emission>

By use of each of the organic EL elements obtained in Example 1 and Comparative Example 2, intensities of emission spectra were measured for eight measurement positions at which the measuring angles were 0°, 10°, 20°, 30°, 40°, 50°, 60°, and 70°, respectively, on the basis of integral areas of emission spectra of light having wavelengths of 450 to 700 nm. For the measurement of the intensities of emission spectra, a measuring system manufactured by Ocean Optics, Inc. under the product name of "USB-2000" was used, and spectra of light emitted from randomly selected measuring points on the organic EL element were measured with a voltage of approximately 10 V being applied to the organic EL element. In addition, for the measurement of the intensity of emission spectrum, the distance between a light-receiving portion for receiving emission spectra and each measuring point on the surface of the organic EL element was set to be 10 cm.

Figure 13:
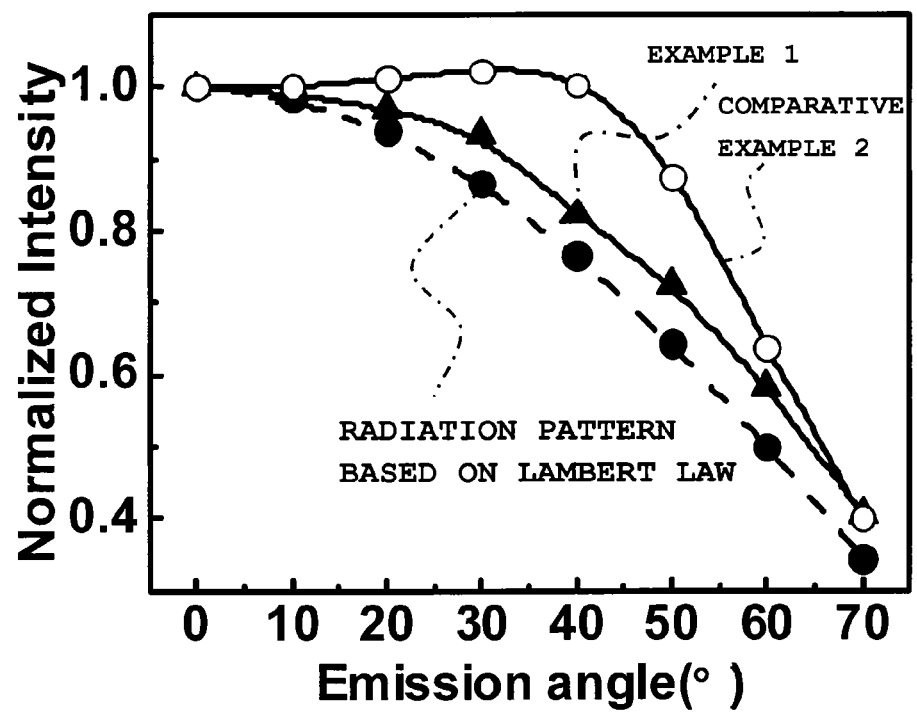
FIG. 13 shows a graph showing a relationship between values obtained by normalizing measured values of intensities of emission spectra of an organic EL element obtained in each of Example 1 and Comparative Example 2 and measuring angles, as well as a graph showing a radiation pattern based on the Lambert law for a case where an intensity of an emission spectrum at a position of an angle of 0° is taken as 1.0.

Then, a normalized value of intensity of an emission spectrum (a value obtained by dividing the measured value at each measuring angle by the measured value at an measuring angle of 0°) was determined by normalizing the measured value of intensity of the emission spectrum thus determined at each measuring angle with respect to the measured value of intensity of an emission spectrum at a measuring angle of 0°. FIG. 13 shows a graph showing, for each of the organic EL elements, a relationship between normalized values of intensity of emission spectra and measuring angles, the normalized values being determined on the basis of integral areas of emission spectra of light having wavelengths of 450 to 700 nm, as well as a graph showing a radiation pattern based on the Lambert law for a case where an intensity of an emission spectrum at a position of an angle of 0° is taken as 1.0.

Figure 14:
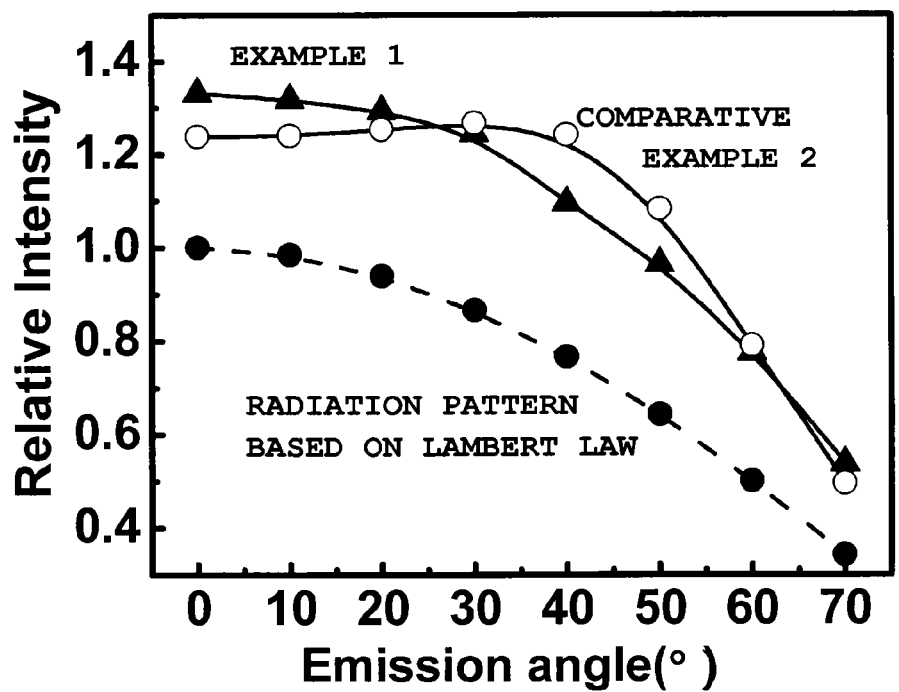
FIG. 14 shows a graph showing a relationship between relative values of intensities of emission spectra of the organic EL element obtained in each of Example 1 and Comparative Example 2 and measuring angles, the relative values being obtained by normalization with respect to an intensity of an emission spectrum at the position of an angle of 0° in the radiation pattern based on the Lambert law, as well as a graph showing a radiation pattern based on the Lambert law for a case where the intensity of the emission spectrum at the position of an angle of 0° is taken as 1.0.

Meanwhile, FIG. 14 shows, for light having wavelengths of 450 to 700 nm, a graph showing a relationship between relative values of intensities of emission spectra of each organic EL element and measuring angles, the relative values being obtained by normalization with respect to a value (theoretical value) of intensity of an emission spectrum at a position of an angle of 0° on the radiation pattern based on the Lambert law, as well as a graph of the radiation pattern based on the Lambert law for a case where the intensity of the emission spectrum at the position of an angle of 0° was taken as 1.0. Moreover, FIG. 15 shows a graph showing a relationship between enhancement ratios of intensities of emission spectra of light having wavelengths of 450 to 700 nm measured for each organic EL element with respect to the radiation pattern based on the Lambert law, and measuring angles.

Figure 15:
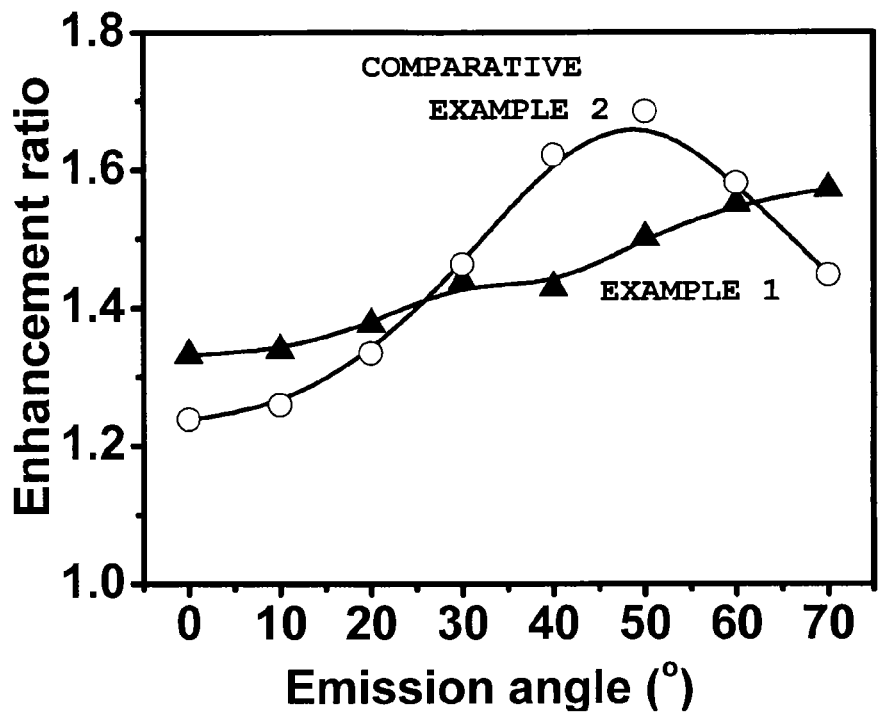
FIG. 15 is a graph showing a relationship between enhancement ratios of intensities of emission spectra of light having wavelengths of 450 to 700 nm of the organic EL element obtained in each of Example 1 and Comparative Example 2 with respect to the radiation pattern based on the Lambert law, and measuring angles.

From the results shown in FIGS. 13 to 15, it was found that the organic EL element comprising the microlens (A) (Example 1) had a radiation pattern more similar to that based on the Lambert law than the organic EL element comprising the microlens (B) for comparison (Comparative Example 2), and the angle-dependence of light emission was more reduced in Example 1 than in Comparative Example 2. Moreover, when a calculation was made on the basis of the data shown in FIG. 13 by using the following equation:

$$Z = \Sigma (y(\theta) - y_0(\theta))^2$$

[in the formula, θ represents eight measuring angles of 0°, 10°, 20°, 30°, 40°, 50°, 60°, and 70°, and y(θ) represents normalized values of intensities of emission spectra at the angles θ in FIG. 13, and $y_0(\theta)$ represents theoretical values of intensities of emission spectra at the angles θ determined from the radiation pattern based on the Lambert law], the value of Z for the organic EL element comprising the microlens (A) (Example 1) was 0.026, whereas the value of Z for the organic EL element comprising the microlens (B) (Comparative Example 2) was 0.16. A smaller value of Z (the sum of squares of differences between the normalized values and the theoretical values) indicates that a radiation pattern more conforming to the radiation pattern based on the Lambert law is obtained. Hence, it was found that the organic EL element comprising the microlens of the present invention (Example 1) had a radiation pattern closer to that based on the Lambert law, and that the angle-dependence of light emission thereof was sufficiently reduced.

<Measurement of Color Coordinate>

Figure 16:
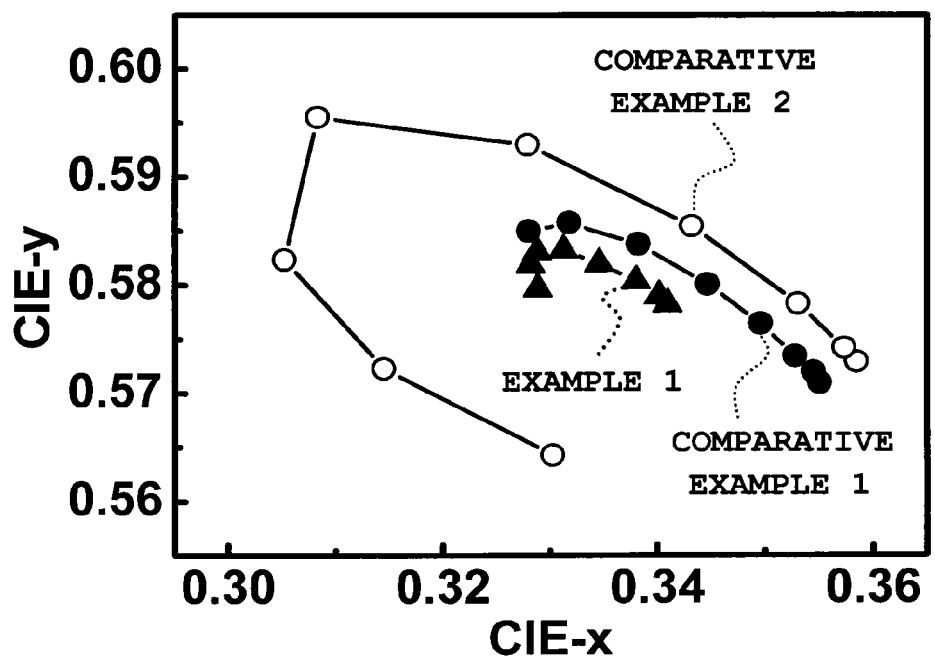
FIG. 16 is a CIE xy chromaticity diagram of organic EL elements obtained in Example 1 and Comparative Examples 1 and 2.

By employing a method similar to the method for measuring an intensity of an emission spectrum employed for the above-described angle-dependence of light emission, intensities of emission spectra of light having wavelengths of 380 to 780 nm of the organic EL elements obtained in Example 1 and Comparative Examples 1 to 2 were measured. On the basis of such data of the intensities of the emission spectra, a CIE xy chromaticity diagram was obtained in accordance with JIS-Z8701: 1999 (Method for Specifying Colour—XYZ colour specification system and X10Y10Z10 colour specification system). FIG. 16 shows the thus obtained CIE xy chromaticity diagrams for the organic EL elements obtained in Example 1 and Comparative Examples 1 and 2. In addition, Table 1 shows amounts of change in CIE x, amounts of change in CIE y, and distances between color coordinates.

TABLE 1

|  | amount of change in CIE x | amount of change in CIE y | Maximum value of distance between color coordinates |
|---|---|---|---|
| Example 1 | $0.328 < x < 0.341$ ($\Delta x = 0.013$) | $0.578 < y < 0.583$ ($\Delta y = 0.005$) | 0.013 |
| Comparative Example 1 | $0.327 < x < 0.355$ ($\Delta x = 0.028$) | $0.571 < y < 0.586$ ($\Delta y = 0.015$) | 0.030 |
| Comparative Example 2 | $0.305 < x < 0.358$ ($\Delta x = 0.053$) | $0.564 < y < 0.596$ ($\Delta y = 0.032$) | 0.055 |

As is apparent from the results shown in FIG. 16 and Table 1, it was shown that the change in chromaticity was extremely reduced in the organic EL element comprising the microlens of the present invention (Example 1) in comparison with the organic EL elements for comparison (Comparative Example 1 to 2).

<Evaluation of Light Emission Efficiency>

A light emission efficiency of the organic EL element obtained in each of Example 1 and Comparative Examples 1 and 2 was measured by the following method. Specifically, first, a voltage was applied to the organic EL element, then the applied voltage (V) and a current (I) flowing through the organic EL element were measured with a measuring instrument (manufactured by Keithley Instruments Inc., model No.: 2400). In addition, an intensity of an emission spectrum was measured from an integral area of an emission spectrum of light having wavelengths of 450 to 700 nm in the following manner. For the measurement of the intensities of emission spectra, a measuring system manufactured by Ocean Optics, Inc. under the product name of "USB-2000" was used, and spectra of light having wavelengths of 450 to 700 nm emitted from a measuring point of an angle of 0° on the organic EL element were measured with a voltage of approximately 10 V being applied to the organic EL element. Thereafter, an integral area is determined from the spectrum data, and thus an intensity of an emission spectrum was measured from the integral area. For the measurement of the intensity of the emission spectrum, the distance between a light-receiving portion for receiving emission spectra and the measuring point on the surface of the organic EL element was set to 10 cm.

Next, the value of the intensity of the emission spectrum of light having wavelengths of 450 to 700 nm measured for each organic EL element (a value of integral area of the emission spectrum of light having wavelengths of 450 to 700 nm) was normalized with respect to the intensity of the emission spectrum of the organic EL element which comprised no microlens and which was obtained in Comparative Example 1. Thus, the light emission efficiencies were determined.

The result of the measurement was that, at the time of 10-V application, the organic EL element of the present invention (Example 1) had a light emission efficiency which was 1.34 times greater than that of the organic EL element comprising no microlens (Comparative Example 1). Hence, it was shown that the efficiency of extracting light to the outside of the organic EL element of the present invention (Example 1) was sufficient. Note that when the organic EL element of the present invention (Example 1) was compared with the organic EL element comprising the microlens (B) (Comparative Example 2), the light emission efficiencies at the time of 10-V application were both 1.34 times. Hence, it was shown that the efficiencies of extracting light to the outside in the two cases were at similar levels. These results showed that the organic EL element of the present invention (Example 1) had a sufficiently high level of light-extraction efficiency.

As has been described above, according to the present invention, it is possible to provide a microlens for an organic EL element, the microlens having a sufficiently high light-extraction efficiency, being capable of sufficiently reducing the angle-dependence of emitted light, and also being capable of sufficiently reducing the change in chromaticity, as well as to provide an organic EL element using the same, and manufacturing methods thereof.

Accordingly, the microlens of the present invention is excellent in that the angle-dependence and the change in chromaticity of emitted light can be reduced sufficiently. Hence, the microlens of the present invention is particularly useful as a microlens used for an organic EL element which is used for white light illumination and the like.

What is claimed is:

1. A method for manufacturing a microlens for an organic EL element, comprising the steps of:

applying a curable resin onto one surface of a supporting base member, curing the curable resin with a master block being pressed thereto, and thereafter detaching the master block, thereby forming a cured resin layer having concavities and convexities formed on a surface thereof, to obtain a microlens for an organic EL element, said microlens comprising the cured resin layer having concavities and convexities formed on a surface thereof, wherein when a Fourier-transformed image is obtained by performing two-dimensional fast Fourier transform processing on a concavity and convexity analysis image obtained by analyzing a shape of the concavities and convexities by use of an atomic force microscope, the Fourier-transformed image shows a circular or annular pattern substantially centered at an origin at which an absolute value of wavenumber is 0 μm and the circular or annular pattern is present within a region where an absolute value of wavenumber is within a range of 1 μm$^{-1}$ or less, and said master block being obtained by a method comprising the steps of:

forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film; and attaching a master block material onto the vapor-deposition film, then curing the master block material, and thereafter detaching the cured master block material from the vapor-deposition film, thereby obtaining a master block.

2. The method for manufacturing a microlens for an organic EL element according to claim 1, wherein the polymer whose volume changes by heat is a silicone-based polymer.

3. A method for manufacturing an organic EL element, the organic EL element comprising a transparent supporting substrate, a transparent electrode, an organic layer, and a metal electrode, said method comprising a step of stacking a microlens for an organic EL element on a light-emitting surface of the transparent supporting substrate, said microlens comprising a cured resin layer having concavities and convexities formed on a surface thereof, wherein a Fourier-transformed image of said concavities and convexities shows a circular or annular pattern substantially centered at an origin at which an absolute value of wave number is $0 \ \mu m^{-1}$, and the circular or annular pattern is present within a region where an absolute value of wave number is within a range of $1 \ \mu m^{-1}$ or less, wherein said Fourier-transformed image is obtained by performing two-dimensional fast Fourier transform processing on a concavity and convexity analysis image, and said concavity and convexity analysis image is obtained by analyzing a shape of the concavities and convexities using an atomic force microscope, wherein, when intensities of emission spectra are measured at randomly selected measuring points on the surface on which the concavities and convexities are formed, wherein light incident on the surface of the cured resin layer on which said concavities and convexities are not formed exits from the surface of said cured resin layer on which the concavities and convexities are formed, said cured resin layer satisfies a condition represented by the following inequality (1):

$$\Sigma(y(\theta)-y_0(\theta))^2 \leq 0.05 \qquad (1)$$

wherein

θ represents eight measuring angles of 0°, 10°, 20°, 30°, 40°, 50°, 60°, and 70°, 0° represents the measuring angle in a direction perpendicular to the surface of said cured resin layer, y(θ) represents values obtained by normalizing measured values of intensities of emission spectra at the angles θ with respect to a measured value of an intensity of an emission spectrum at an angle of 0°, wherein the normalized theoretical value y(0) of the intensity spectrum at an angle of 0° is 1.0, and $y_0(\theta)$ represents values obtained by normalizing theoretical values, determined from a radiation pattern based on the Lambert law, of intensities of emission spectra at the angles θ with respect to a theoretical value, determined from the radiation pattern, of an intensity of an emission spectrum at an angle of 0°.

* * * * *